US008963214B2

(12) United States Patent
Kondratyuk et al.

(10) Patent No.: US 8,963,214 B2
(45) Date of Patent: Feb. 24, 2015

(54) THIN FILM TRANSISTOR, METHOD OF MANUFACTURING THE THIN FILM TRANSISTOR AND ORGANIC LIGHT EMITTING DISPLAY DEVICE HAVE THE THIN FILM TRANSISTOR (75) Inventors: Roman Kondratyuk, Yongin (KR); Ki-Ju Im, Yongin (KR); Dong-Wook Park, Yongin (KR); Yeon-Gon Mo, Yongin (KR); Hye-Dong Kim, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 308 days.

(21) Appl. No.: 12/892,820

(22) Filed: Sep. 28, 2010

(65) Prior Publication Data

US 2011/0084262 A1    Apr. 14, 2011

(30) Foreign Application Priority Data

Oct. 12, 2009    (KR) .................. 10-2009-0096759

(51) Int. Cl.
*H01L 27/148*    (2006.01)
*H01L 29/786*    (2006.01)
(Continued)

(52) U.S. Cl.
CPC ...... *H01L 29/7869* (2013.01); *H01L 29/78645* (2013.01); *H01L 29/78696* (2013.01); *H01L 27/1225* (2013.01); *H01L 27/3262* (2013.01)
USPC ...... 257/250; 257/43; 257/401; 257/E29.117; 257/E29.275

(58) Field of Classification Search
USPC ................ 257/250, 266, 270, 365, 366, 401, 257/E29.134, E29.135, E29.264, E29.265, 257/E29.269, 43, 288, E29.275, E29.112, 257/E29.122, E29.117, E29.136, E29.137, 257/E51.019, E29.29, E29.293
See application file for complete search history.

(56) References Cited

U.S. PATENT DOCUMENTS 5,124,769 A * 6/1992 Tanaka et al. .................... 257/66
5,955,765 A   9/1999 Yamazaki et al.
(Continued)

FOREIGN PATENT DOCUMENTS

JP    03-254157 A    11/1991
JP    06-013407 A    1/1994
(Continued)

OTHER PUBLICATIONS

Korean Office Action dated Feb. 22, 2011 for Korean Application No. KR 10-2009-0096759 which corresponds to the captioned application.
(Continued)

*Primary Examiner* — Davienne Monbleau
*Assistant Examiner* — Leslie Pilar Cruz
(74) *Attorney, Agent, or Firm* — Knobbe Martens Olson & Bear LLP (57) ABSTRACT A thin film transistor for an organic light emitting display device is disclosed. In one embodiment, the thin film transistor includes: a substrate, an active layer formed over the substrate, wherein the active layer is formed of an oxide semiconductor, a gate insulating layer formed over the substrate and the active layer, and source and drain electrodes formed on the gate insulating layer and electrically connected to the active layer. The transistor may further include a gate electrode formed on the gate insulating layer and formed between the source and drain electrodes, wherein the gate electrode is spaced apart from the source electrode so as to define a first offset region therebetween, and wherein the gate electrode is spaced apart from the drain electrode so as to define a second offset region therebetween. The transistor may further include a passivation layer formed on i) the gate insulating layer, ii) the source and drain electrodes and iii) the gate electrode; and at least one auxiliary gate electrode formed on the passivation layer, wherein at least a portion of the auxiliary gate electrode is located directly above the first and second offset regions.

20 Claims, 7 Drawing Sheets (51) Int. Cl.
*H01L 27/12* (2006.01)
*H01L 27/32* (2006.01)

(56) References Cited

U.S. PATENT DOCUMENTS

| | | | |
|---|---|---|---|
| 6,133,609 A * | 10/2000 | Nakamura | 257/347 |
| 7,453,087 B2 | 11/2008 | Iwasaki | |
| 2003/0136963 A1 | 7/2003 | Krivokapic et al. | |
| 2004/0075122 A1 | 4/2004 | Lin et al. | |
| 2004/0092060 A1 | 5/2004 | Gambino et al. | |
| 2005/0263761 A1 | 12/2005 | Kim et al. | |
| 2006/0046336 A1 * | 3/2006 | Shoji et al. | 438/30 |
| 2007/0172591 A1 | 7/2007 | Seo et al. | |
| 2008/0036698 A1 * | 2/2008 | Kawasaki et al. | 345/55 |
| 2008/0197350 A1 | 8/2008 | Park et al. | |
| 2008/0283842 A1 | 11/2008 | Hayashi et al. | |
| 2009/0127551 A1 | 5/2009 | Imai | |
| 2010/0051936 A1 | 3/2010 | Hayashi et al. | |
| 2010/0084649 A1 * | 4/2010 | Seo et al. | 257/43 |

FOREIGN PATENT DOCUMENTS

| | | |
|---|---|---|
| JP | 06-151852 A1 | 5/1994 |
| JP | 06-252405 A1 | 9/1994 |
| JP | 2855155 B2 | 11/1998 |
| JP | 2004-273614 | 9/2004 |
| JP | 2005-340775 A1 | 12/2005 |
| JP | 2007-194628 A | 8/2007 |
| JP | 2008-166716 A | 7/2008 |
| JP | 2008-288424 A | 11/2008 |
| JP | 2009-099778 | 5/2009 |
| JP | 2009-135350 A | 6/2009 |
| JP | 2009-158883 A | 7/2009 |
| JP | 2009-176865 A | 8/2009 |
| JP | 2010-212284 A | 9/2010 |
| KR | 10-0174031 B1 | 2/1999 |
| KR | 1999-0031885 A | 5/1999 |
| KR | 10-2008-0104756 A | 12/2008 |
| KR | 10-2008-0109998 A | 12/2008 |

OTHER PUBLICATIONS

Korean Office Action dated Feb. 22, 2011 for Korean Application No. KR 10-2009-0094561 corresponding to U.S. Appl. No. 12/892,855 which is related to the captioned application.

Korean Office Action dated Jul. 8, 2011 for Korean Patent Application No. KR 10-2009-0096759 which corresponds to captioned U.S. Appl. No. 12/892,820.

Japanese Office Action dated Sep. 25, 2012 for Japanese Patent Application No. JP 2010-092500 which shares priority of Korean Patent Application No. KR 10-2009-0096759 with captioned U.S. Appl. No. 12/892,820.

Japanese Office Action dated Sep. 18, 2012 for Japanese Patent Application No. JP 2010-093032 which shares priority of Korean Patent Application No. KR 10-2009-0094561 with U.S. Appl. No. 12/892,855, filed Sep. 28, 2010, which is related to captioned U.S. Appl. No. 12/892,820.

Office Action dated Oct. 9, 2012 for U.S. Appl. No. 12/892,855, filed Sep. 28, 2010, which is related to captioned U.S. Appl. No. 12/892,820.

Japanese Office Action dated Apr. 2, 2013 for Japanese Patent Application No. JP 2010-092500 which shares priority of Korean Patent Application No. KR 10-2009-0096759 with captioned U.S. Appl. No. 12/892,820.

* cited by examiner

THIN FILM TRANSISTOR, METHOD OF MANUFACTURING THE THIN FILM TRANSISTOR AND ORGANIC LIGHT EMITTING DISPLAY DEVICE HAVE THE THIN FILM TRANSISTOR

CROSS-REFERENCE TO RELATED APPLICATIONS

This application claims priority to and the benefit of Korean Patent Application No. 10-2009-0096759, filed on Oct. 12, 2009, in the Korean Intellectual Property Office, the entire content of which is incorporated herein by reference.

This application relates to U.S. patent application entitled "Thin film transistor, method of manufacturing the thin film transistor and organic light emitting display device having thin film transistor" Ser. No. 12/892,855, which is concurrently filed as this application and incorporated herein by reference in its entirety.

BACKGROUND

1. Field of the Invention

Embodiments relate to a thin film transistor using an oxide semiconductor as an active layer, a method of manufacturing the thin film transistor, and an organic light emitting display device having the thin film transistor. More particularly, embodiments relate to a thin film transistor having an auxiliary gate electrode, a method of manufacturing the thin film transistor, and an organic light emitting display device having the thin film transistor.

2. Discussion of the Related Technology

In general, a thin film transistor includes an active layer providing a channel region, a source region, and a drain region and a gate electrode that is superimposed on the channel region and is insulated from the active layer by a gate insulating layer.

SUMMARY OF CERTAIN INVENTIVE ASPECTS

One aspect is a thin film transistor of which electrical characteristics can be improved, a method of manufacturing the thin film transistor, and an organic light emitting display device having the thin film transistor.

Another aspect is a thin film transistor capable of reducing the number of masks used in a manufacturing process, a method of manufacturing the thin film transistor, and an organic light emitting display device having the thin film transistor.

Another aspect is a thin film transistor which includes: a substrate; an active layer formed on the substrate by an oxide semiconductor; a gate insulating layer formed on the substrate including the active layer; source and drain electrodes formed on the gate insulating layer to connect the active layer; a gate electrode formed on the gate insulating layer between the source and drain electrodes; a passivation layer formed on the gate insulating layer including the source and drain electrodes and the gate electrode; and auxiliary gate electrodes formed on the passivation layer to correspond to offset regions between the source and drain electrodes and the gate electrode.

Another aspect is a method of manufacturing a thin film transistor which includes: forming an active layer on the substrate by an oxide semiconductor; forming a gate insulating layer on the substrate including the active layer; forming source and drain electrodes connected to the active layer on the gate insulating layer and a gate electrode disposed between the source and drain electrodes; forming a passivation layer on the gate insulating layer including the source and drain electrodes and the gate electrode; and forming auxiliary gate electrodes on the passivation layer to correspond to offset regions between the source and drain electrode and the gate electrode.

Another aspect is an organic light emitting display device having a thin film transistor which includes: a first substrate where an organic light emitting device constituted by a first electrode, an organic light emitting layer, and a second electrode and a thin film transistor for controlling an operation of the organic light emitting device; and a second substrate disposed to face the first substrate, wherein the thin film transistor includes an active layer formed on the first substrate by an oxide semiconductor; a gate insulating layer formed on the first substrate including the active layer; source and drain electrodes formed on the gate insulating layer to connect the active layer; a passivation layer formed on the gate insulating layer including the source and drain electrodes and the gate electrode; and auxiliary gate electrodes formed on the passivation layer to correspond to offset regions between the source and drain electrodes and the gate electrode.

Another aspect is a thin film transistor which includes a gate electrode formed between a source electrode and a drain electrode and an auxiliary gate electrode formed to corresponding to an offset region between the source and drain electrodes and the gate electrode. An electric filed is applied even to the offset region between the source and drain electrodes and the gate electrode by bias voltage applied to the auxiliary gate electrode, such that a channel is additionally formed on an active layer, thereby improving current characteristics in comparison with a known thin film transistor. Further, in the thin film transistor of the present invention, since the source and drain electrodes and the gate electrode are formed by the same material on the same plane, the source and drain electrodes and the gate electrode can be simultaneously formed by using one mask. Accordingly, a manufacturing cost is saved by reducing the number of masks used in a manufacturing process. Another aspect is a thin film transistor, comprising: a substrate; an active layer formed over the substrate, wherein the active layer is formed of an oxide semiconductor; a gate insulating layer formed over the substrate and the active layer; source and drain electrodes formed on the gate insulating layer and electrically connected to the active layer; a gate electrode formed on the gate insulating layer and formed between the source and drain electrodes, wherein the gate electrode is spaced apart from the source electrode so as to define a first offset region therebetween, and wherein the gate electrode is spaced apart from the drain electrode so as to define a second offset region therebetween; a passivation layer formed on i) the gate insulating layer, ii) the source and drain electrodes and iii) the gate electrode; and at least one auxiliary gate electrode formed on the passivation layer, wherein at least a portion of the auxiliary gate electrode is located directly above the first and second offset regions.

In the above transistor, the source and drain electrodes are electrically connected to the active layer through a contact hole formed on the gate insulating layer. In the above transistor, the oxide semiconductor contains zinco oxide (ZnO). In the above transistor, the oxide semiconductor comprises at least one ion of: gallium (Ga), indium (In), stanium (Sn), zirconium (Zr), hafnium (Hf), cadmium (Cd), magnesium (Mg), and vanadium (V). In the above transistor, the oxide semiconductor comprises at least one ion of 1-group elements, 13-group elements, 14-group elements, 15-group elements, and 17-group elements. In the above transistor, the at least one auxiliary gate electrode comprises first and second auxiliary gate electrodes which are spaced apart from each other, wherein at least a portion of the first auxiliary gate electrode is located directly above the first offset region, and wherein at least a portion of the second auxiliary gate electrode is located directly above the second offset region.

Another aspect is a thin film transistor, comprising: a substrate; source and drain electrodes formed over the substrate; a gate electrode formed over the substrate and formed between the source and drain electrodes, wherein the gate electrode is spaced apart from the source electrode so as to define a first offset region therebetween, and wherein the gate electrode is spaced apart from the drain electrode so as to define a second offset region therebetween; a gate insulating layer covering the gate electrode; an active layer formed on i) the gate insulating layer, ii) the source and drain electrodes and iii) at least part of the first and second offset regions; a passivation layer formed on the active layer; and at least one auxiliary gate electrode formed on the passivation layer, wherein at least a portion of the auxiliary gate electrode is located directly above the first and second offset regions.

In the above transistor, at least part of the auxiliary gate electrode overlaps with the gate electrode. In the above transistor, the at least one auxiliary gate electrode is a single piece electrode. In the above transistor, the source and drain electrodes and the gate electrode are made of the same material. In the above transistor, the oxide semiconductor contains zinc oxide (ZnO).

Another aspect is a method of manufacturing a thin film transistor, comprising: forming an semiconductor active layer over a substrate; forming a gate insulating layer over the substrate and the active layer; forming i) source and drain electrodes, electrically connected to the active layer, on the gate insulating layer and ii) a gate electrode between the source and drain electrodes, wherein the gate electrode is spaced apart from the source electrode so as to define a first offset region therebetween, and wherein the gate electrode is spaced apart from the drain electrode so as to define a second offset region therebetween; forming a passivation layer on i) the gate insulating layer, ii) the source and drain electrodes and iii) the gate electrode; and forming at least one auxiliary gate electrode on the passivation layer, wherein at least a portion of the auxiliary gate electrode is located directly above the first and second offset regions.

In the above method, the forming the source and drain electrodes, and the gate electrode comprises: forming a contact hole on the gate insulating layer to expose a predetermined part of the active layer; forming a conductive layer on the gate insulating layer to fill the contact hole; and forming the source and drain electrodes and the gate electrode by patterning the conductive layer. In the above method, the at least one auxiliary gate electrode comprises first and second auxiliary gate electrodes which are spaced apart from each other, wherein at least a portion of the first auxiliary gate electrode is located directly above the first offset region, and wherein at least a portion of the second auxiliary gate electrode is located directly above the second offset region. In the above method, at least a portion of the auxiliary gate electrode overlaps with the gate electrode.

Another aspect is an organic light emitting display device, comprising: a first substrate; a second substrate disposed to face the first substrate, an organic light emitting device interposed between the first and second substrates, wherein the organic light emitting device comprises a first electrode, an organic light emitting layer, a second electrode and a thin film transistor configured to control an operation of the organic light emitting device; and wherein the thin film transistor comprises: a substrate; an active layer formed over the substrate, wherein the active layer is formed of an oxide semiconductor; a gate insulating layer formed over the substrate and the active layer; source and drain electrodes formed on the gate insulating layer and electrically connected to the active layer; a gate electrode formed on the gate insulating layer and formed between the source and drain electrodes, wherein the gate electrode is spaced apart from the source electrode so as to define a first offset region therebetween, and wherein the gate electrode is spaced apart from the drain electrode so as to define a second offset region therebetween; a passivation layer formed on i) the gate insulating layer, ii) the source and drain electrodes and iii) the gate electrode; and at least one auxiliary gate electrode formed on the passivation layer, wherein at least a portion of the auxiliary gate electrode is located directly above the first and second offset regions.

In the above device, the source and drain electrodes are electrically connected to the active layer through a contact hole formed on the gate insulating layer. In the above device, at least part of the auxiliary gate electrode overlaps with the gate electrode. In the above device, the at least one auxiliary gate electrode comprises first and second auxiliary gate electrodes which are spaced apart from each other, wherein at least a portion of the first auxiliary gate electrode is located directly above the first offset region, and wherein at least a portion of the second auxiliary gate electrode is located directly above the second offset region. In the above device, the auxiliary gate electrode and the first electrode are made of the same material on the same plane.

DETAILED DESCRIPTION OF CERTAIN INVENTIVE EMBODIMENTS

An active layer of a thin film transistor is generally made of a semiconductor material such as amorphous silicon or poly-silicon. However, when the active layer is made of the amorphous silicon, since mobility is low, it is difficult to implement a driving circuit that operates at high speed. Further, when the active layer is made of the poly-silicon, although the mobility is high, since threshold voltage is non-uniform, an additional compensation circuit needs to be added.

Further, since a method of manufacturing the thin film transistor using low temperature poly-silicon (LTPS) includes a high-price process such as laser processing, etc., it is difficult to control characteristics, and thus the method is difficult to be applied to a large-area substrate.

Japanese Unexamined Patent Publication No. 2004-273614 discloses a thin film transistor using zinc oxide (ZnO) or an oxide semiconductor containing zinc oxide (ZnO) as a principle ingredient as an active layer.

The oxide semiconductor containing zinc oxide (ZnO) as the principle ingredient is evaluated as a stable material while having an amorphous form. When using the oxide semiconductor as the active layer, it is possible to manufacture the thin film transistor at low temperature by using the existing process equipment without additionally purchasing an additional process equipment and an ion injection process is omitted.

However, since the thin film transistor using the oxide semiconductor as the active layer is easily changed in electrical characteristics in accordance with a structure and a process condition, the thin film transistor has low reliability. In particular, current characteristics are deteriorated while static-voltage or static-current driving to vary the threshold voltage, thereby deteriorating the electrical characteristics.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the another element or be indirectly on the another element with one or more intervening elements interposed therebetween. Also, when an element is referred to as being "connected to" another element, it can be directly connected to the another element or be indirectly connected to the another element with one or more intervening elements interposed therebetween. Hereinafter, like reference numerals refer to like elements.

Hereinafter, embodiments of the present invention will be described in detail with reference to the accompanying drawings. Hereinafter, embodiments are provided to be understood to those skilled in the art and can be varied in various forms and the scope of the present invention is not limited to the embodiments to be described below.

Figure 1A:
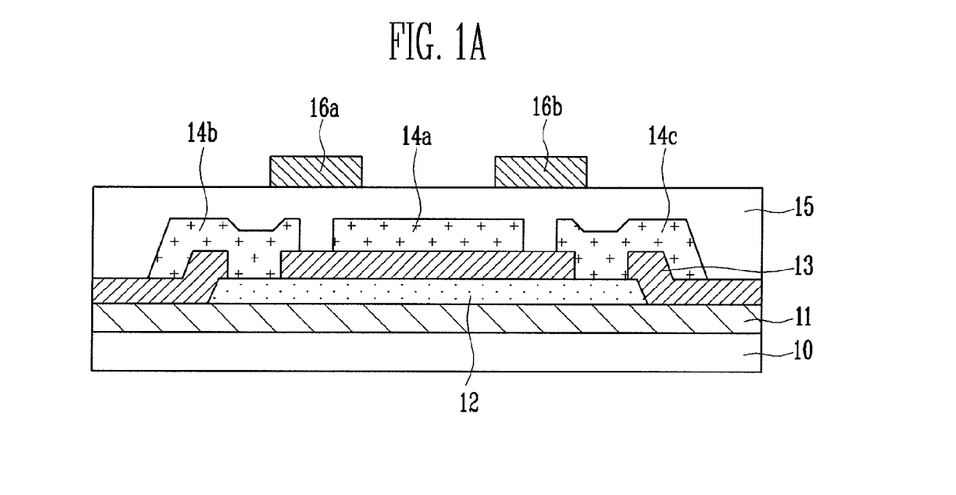
FIGS. 1A and 1B are cross-sectional views showing a thin film transistor having a top gate structure according to an embodiment of the present invention.
Figure 1B:
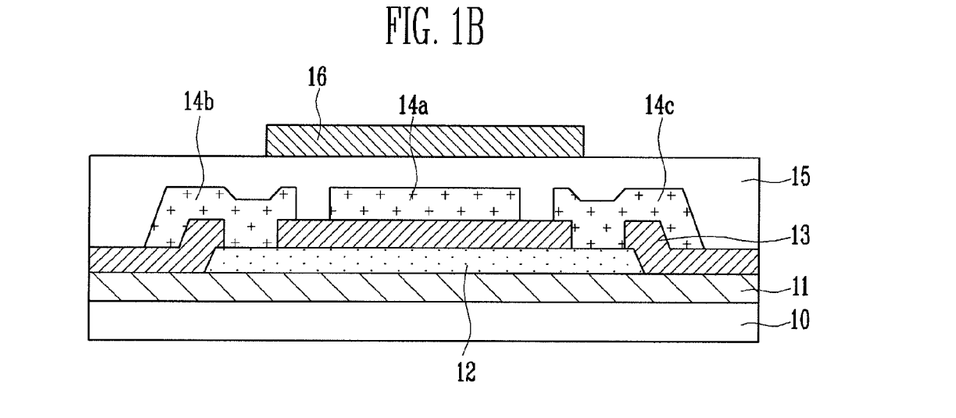

FIGS. 1A and 1B are cross-sectional views for describing one embodiment of a thin film transistor according to an embodiment of the present invention.

In one embodiment, as shown in FIG. 1A, a buffer layer 11 is formed on a substrate 10 and an active layer 12 as an oxide semiconductor is formed on the buffer layer 11. The active layer 12 includes a channel region, a source region, and a drain region.

In one embodiment, a gate insulating layer 13 is formed on the active layer 12 and the substrate 10. Source and drain electrodes 14b and 14c may be electrically connected to the source and drain regions of the active layer 12. A gate electrode 14a may be disposed between the source and drain electrodes 14b and 14c and may be formed on the gate insulating layer 13. In one embodiment, the source and drain electrodes 14b and 14c are electrically connected to the source and drain regions of the active layer 12 through a contact hole formed on the gate insulating layer 13. The source and drain electrodes 14b and 14c may be spaced from the gate electrode 14a by a predetermined distance (hereinafter, the area between the source electrode 14b and gate electrode 14a, and the area between the gate electrode 14a and the drain electrode 14c are referred to as an offset region, or a first offset region and a second offset region, respectively).

A passivation layer 15 may be formed on i) the source and drain electrodes 14b and 14c and ii) the gate electrode 14a. In one embodiment, auxiliary gate electrodes 16a and 16b are formed on the passivation layer 15. In one embodiment, at least a portion of the auxiliary gate electrode 16a and at least a portion of the auxiliary gate electrode 16b are located directly above the first and second offset regions, respectively, as shown in FIG. 1A. In one embodiment, at least a portion of the auxiliary gate electrode 16a and at least a portion of the auxiliary gate electrode 16b overlap with the gate electrode 14a.

In another embodiment, as shown in FIG. 1B, a single auxiliary gate electrode 16 may be formed on the passivation layer 15, instead of the two auxiliary gate electrodes 16a and 16b of the FIG. 1A embodiment. At least a portion of the auxiliary gate electrode 16 may be located directly above the first offset region and at least another portion of the auxiliary gate electrode 16 may be located directly above the second offset region. At least a portion of the auxiliary gate electrode 16 may be located directly above the gate electrode 14a, as shown in FIG. 1B.

In one embodiment, bias voltage VG is applied to the gate electrode 14a and the auxiliary gate electrodes 16a and 16b, and 16. One embodiment is advantageous compared to a thin film transistor having only one gate electrode, where the bias voltage is applied to the gate electrode, and a channel is formed on an active layer below the gate electrode. In one embodiment, since the channels are formed even on the first and second offset regions, which are located above the active layer 12 in addition to the active layer 12 below the gate electrode 14a, current characteristics are improved.

Figure 2A:
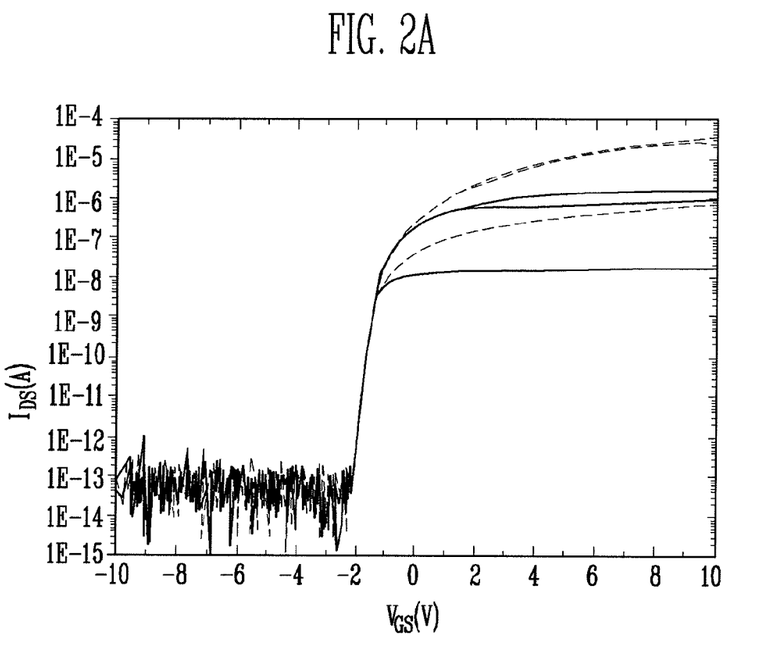
FIG. 2A is a graph showing a variation (transfer curve) of drain current $I_D$ according to gate voltage $V_G$.
Figure 2B:
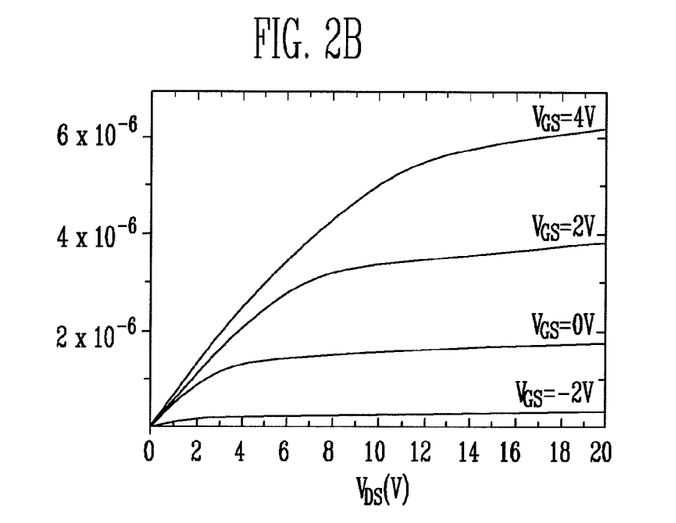
FIG. 2B is a graph showing a variation (transfer curve) of drain current $I_{DS}$ according to drain voltage $V_{DS}$.

FIG. 2A is a graph showing a variation (transfer curve) of drain current $I_{DS}$ according to gate voltage $V_{GS}$ and FIG. 2B is a graph showing a variation (transfer curve) of drain current $I_{DS}$ according to drain voltage $V_{DS}$ of a thin film transistor according to an embodiment of the present invention.

As can be seen from the graph, the thin film transistor (solid line) of one embodiment of the present invention has a threshold voltage ($V_{TH}$) characteristic more improved than the thin film transistor which does not have an auxiliary gate electrode (dotted line).

Although the thin film transistor having the top gate structure has been described, one embodiment includes a thin film transistor having a bottom gate structure.

Figure 3A:
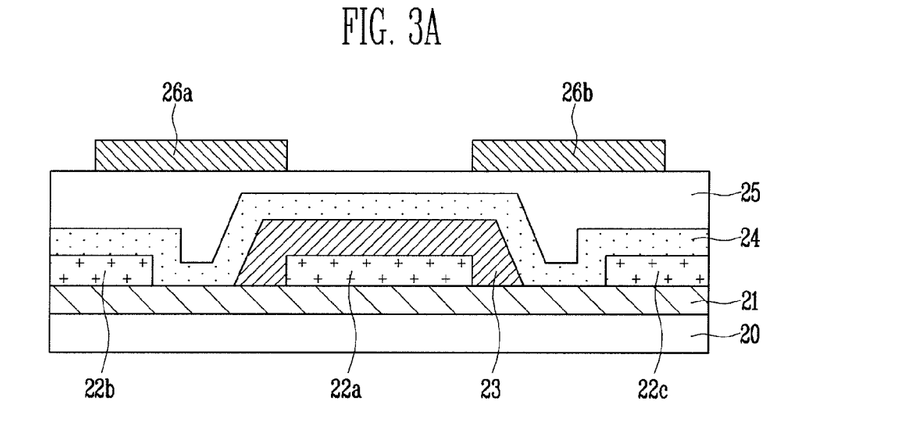
FIGS. 3A and 3B are cross-sectional views for describing a thin film transistor having a bottom gate structure according to an embodiment of the present invention.
Figure 3B:
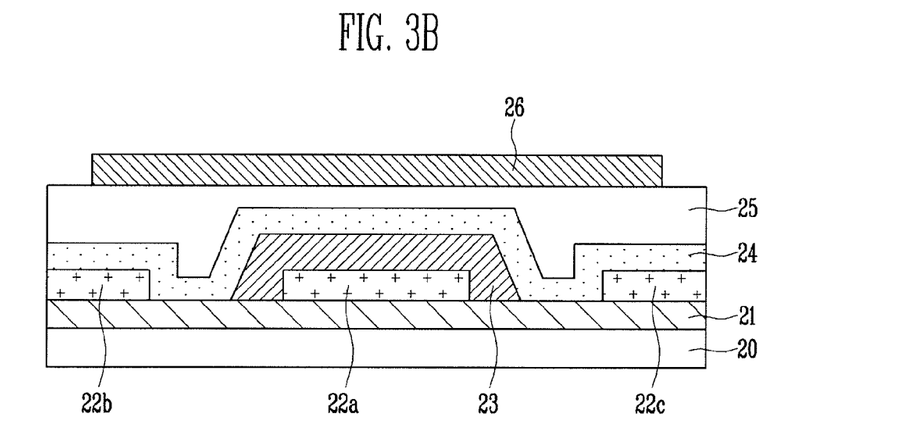

FIGS. 3A and 3B are cross-sectional views for describing a thin film transistor according to another embodiment of the present invention.

In one embodiment, as shown in FIG. 3A, a buffer layer 21 is formed on a substrate 20. Source and drain electrodes 22b and 22c and a gate electrode 22a, disposed between the source and drain electrodes 22b and 22c, may be formed on the buffer layer 21. The area between the source electrode 22b and gate electrode 22a, and the area between the gate electrode 22a and the drain electrode 22c are referred to as an offset region, or a first offset region and a second offset region, respectively.

In one embodiment, a gate insulating layer 23 is formed to substantially completely cover the gate electrode 22a. An active layer 24, formed of, e.g., an oxide semiconductor, may be formed on i) the gate insulating layer 23, ii) the source and drain electrodes 22b and 22c, and iii) at least part of the offset region. The active layer 24 may include a channel region, a source region, and a drain region. The source region may be electrically connected to the source electrode 22b and the drain region may be electrically connected to the drain electrode 22c.

A passivation layer 25 may be formed on the active layer 24. In one embodiment, auxiliary gate electrodes 26a and 26b are formed on the passivation layer 25. Similarly to the FIG. 1 embodiment, at least portions of the auxiliary gate electrodes 26a and 26b may be located directly above the offset region, and at least a portion of the auxiliary gate electrodes 26a and 26b may overlap with the gate electrode 22a, as shown in FIG. 3A.

In another embodiment, as shown in FIG. 3B, a single auxiliary gate electrode 26 may be formed on the passivation layer 25, instead of the two auxiliary gate electrodes 26a and 26b. At least portions of the auxiliary gate electrode 26 may be located directly above the offset region, and at least a portion of the auxiliary gate electrode 26 may be located directly above the gate electrode 22a, as shown in FIG. 3B.

Similarly to the FIG. 1 embodiment, since the channels are formed even on the first and second offset regions, as well as the active layer 24 above the gate electrode 22a, current characteristics are improved.

Figure 4A:
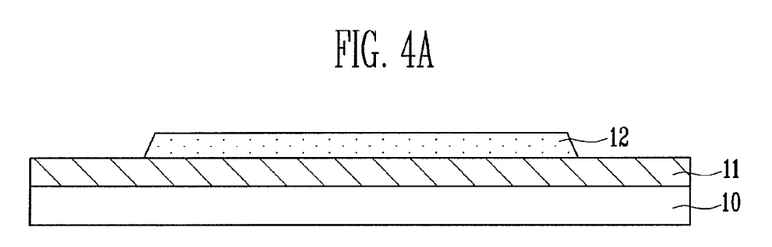
FIGS. 4A-4D are cross-sectional views for describing a method of manufacturing a thin film transistor according to an embodiment of the present invention.
Figure 4B:
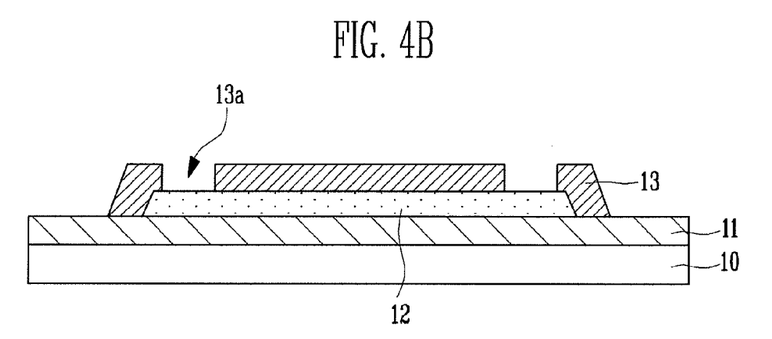

FIGS. 4A and 4B are cross-sectional views for describing a method of manufacturing a thin film transistor according to an embodiment of the present invention and describe the thin film transistor the top gate structure shown in FIG. 1A as an example.

In one embodiment, as shown in FIG. 4A, a buffer layer 11 is formed on a substrate 10 and an active layer 13 providing a channel region, a source region, and a drain region is formed on the buffer layer 11.

A semiconductor substrate made of, for example, silicon (Si), an insulating substrate made of, e.g., glass, plastic, or the like, or a metallic substrate may be used as the substrate 10. The buffer layer 11 may be made of, e.g., a silicon oxide, a silicon nitride, a compound of the silicon oxide and the silicon nitride, or the like. The active layer 13 may be formed by evaporating the oxide semiconductor of an amorphous, polycrystalline, or microcrystalline state using, for example, a sputtering method. The oxide semiconductor contains zinco oxide (ZnO) and at least one ion of gallium (Ga), indium (In), stanium (Sn), zirconium (Zr), hafnium (Hf), cadmium (Cd), magnesium (Mg), and vanadium (V) may be doped on the zinco oxide (ZnO) or at least one ion of 1-group elements (Li, Na, K, Rb, and Cs), 13-group elements (B, Ga, In, and Ti), 14-group elements (C, Si, Ge, Sn, and Pb), 15-group elements (N, P, As, Sb, and Bi), and 17-group elements (F, Cl, Br, and I) may be doped on the zinco oxide (ZnO). The active layer 12 may have a thickness of about 25 nm to about 200 nm, or, a thickness of about 30 nm to about 150 nm. In another embodiment, the active layer 12 may have a thickness less than about 25 nm or greater than about 200 nm.

In one embodiment, as shown in FIG. 4B, a contact hole 13a is formed to expose the source region and the drain region of the active layer 12 by forming and patterning a gate insulating layer 13. The gate insulating layer 13 may be made of, e.g., the silicon oxide, the silicon nitride, the compound of the silicon oxide and the silicon nitride, or the like.

Figure 4C:
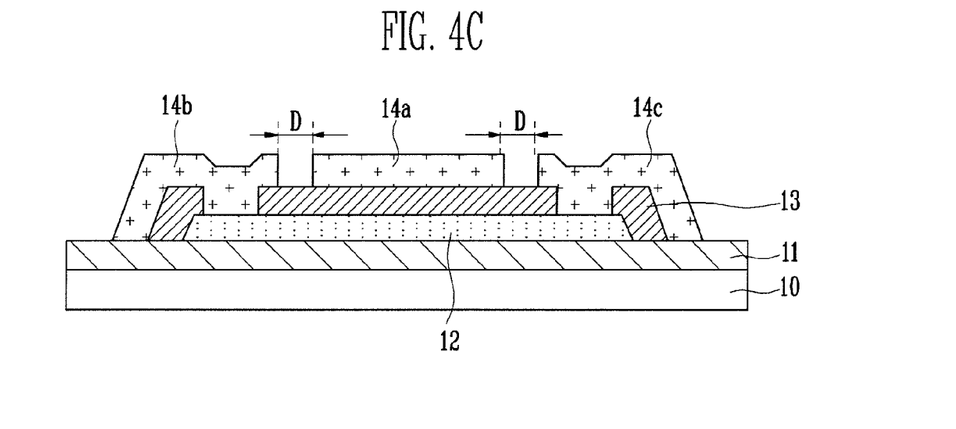

In one embodiment, as shown in FIG. 4C, the source and drain electrodes 14b and 14c are formed such that the electrodes 14b and 14c are connected to the source and drain regions of the active layer 12. The gate electrode 14a may be formed to be disposed between the source and drain electrodes 14b and 14c. The electrodes 14a-14c may be formed by depositing and patterning a conductive layer on the gate insulating layer 13 and burying the contact hole 13a. The source and drain electrodes 14b and 14c may be spaced apart from the gate electrode 14a by the offset region D.

The conductive layer may be formed by evaporating metal, including, but not limited to, tungsten (W), titanium (Ti), molybdenum (Mo), tantalnyum (Ta), aluminum (Al), copper (Cu), gold (Au), chrome (Cr), niobium (Nb), or the like or alloys of the metals by using the sputtering method or may be formed of a doped semiconductor or transparent electrode materials made of ITO, IZO, ITSO, $In_2O_3$, AlZnO, GaZnO, ZnO, etc. The source and drain electrodes 14b and 14c and the gate electrode 14a may have a thickness of about 100 nm to about 200 nm.

Figure 4D:
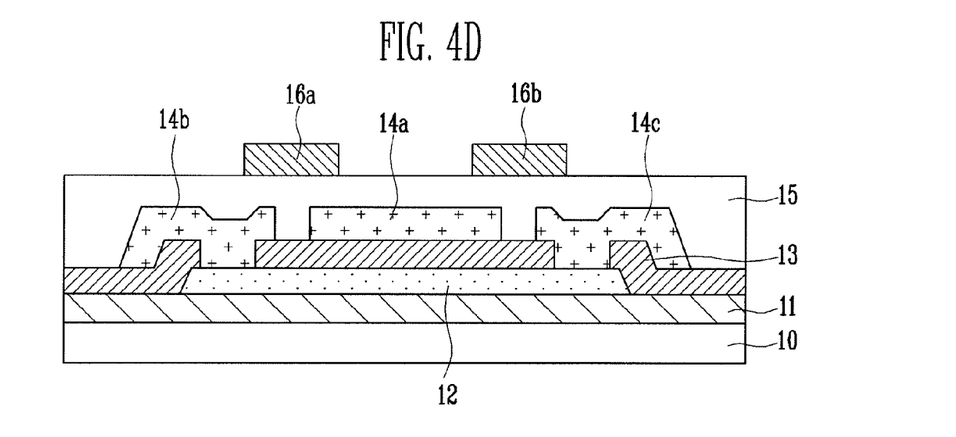

In one embodiment, as shown in FIG. 4D, the passivation layer 15 is formed on i) the source and drain electrodes 14b and 14c, ii) the gate electrode 14a and iii) the gate insulating layer 13. In one embodiment, auxiliary gate electrodes 16a and 16b, having the configuration of the FIG. 1A embodiment, are formed on the passivation layer 15. The auxiliary gate electrodes 16a and 16b may be formed of, e.g., the metal, the doped semiconductor, or the transparent electrode material used for forming the conductive layer.

In one embodiment, the above described thin film transistor can be used for an organic light emitting display device.

Figure 5A:
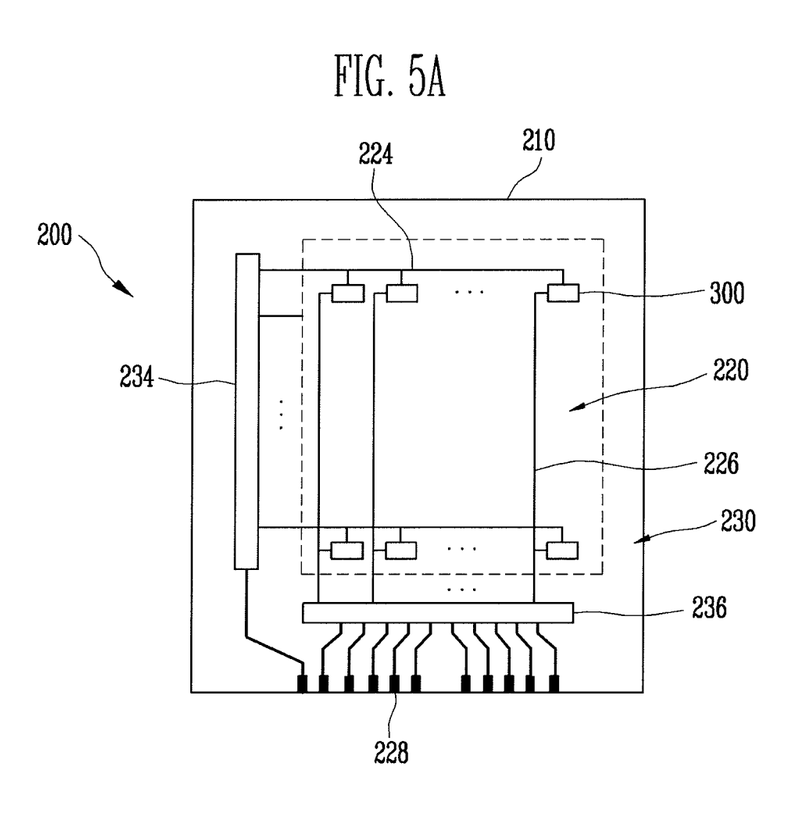
FIGS. 5A and 5B are a plan view and a cross-sectional view for showing one embodiment of an organic light emitting display device having a thin film transistor according to an embodiment of the present invention.
Figure 5B:
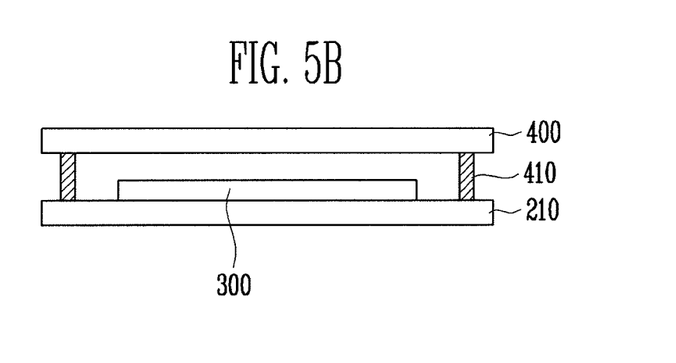

FIGS. 5A and 5B are a plan view and a cross-sectional view for showing one embodiment of an organic light emitting display device having a thin film transistor according to an embodiment of the present invention and primarily describe a display panel 200 displaying an image.

In one embodiment, as shown in FIG. 5A, a substrate 210 is defined by a pixel region 220 and a non-pixel region 230 in the vicinity of the pixel region 220. A plurality of organic light emitting devices 300 connected between a scan line 224 and a data line 226 in a matrix form may be formed on the substrate 210 in the pixel region 220 and connected to the scan line 224 and the data line 226 extending from the scan line 224. A power supply line (not shown), and a scan driver 234 and a data driver 236, which process a signal provided from the outside through a pad 228 and supply the processed signal to the scan line 224 and the data line 226, may be formed on the substrate 210 in the non-pixel region 230.

Figure 6:
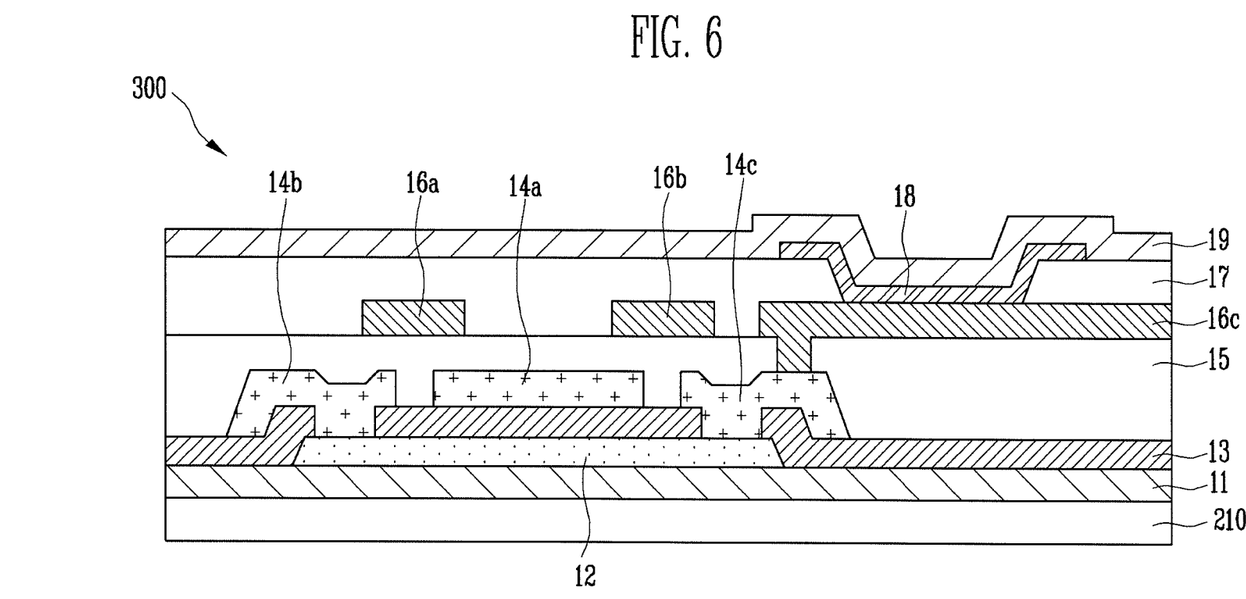
FIG. 6 is a cross-sectional view for describing an organic light emitting device of FIG. 5A.

In one embodiment, as shown in FIG. 6, the organic light emitting device 300 includes an anode electrode 16c, a cathode electrode 19, and an organic light emitting layer 18 formed between the anode electrode 16c and the cathode electrode 19. The organic light emitting layer 18 may further include a hole injection layer, a hole transport layer, an electron transport layer, and an electron injection layer. Further, the organic light emitting layer 18 may further include a thin film transistor for controlling an operation of the organic light emitting device 300 and a capacitor for maintaining a signal.

The thin film transistor has the top gate structure shown in FIGS. 1A and 1B or the bottom gate structure shown in FIGS. 3A and 3B and can be manufactured by the manufacturing method of the present invention by referring to FIGS. 4A to 4D.

Hereinafter, the organic light emitting device 300 including the thin film transistor configured as above will be described in more detail with reference to FIGS. 5A and 6. For convenience of description, the thin film transistor having the top gate structure shown in FIG. 1A will be described as an example.

The buffer layer 11 may be formed on the substrate 210 and the active layer 12, made of, e.g., an oxide semiconductor, may be formed on the buffer layer 11. A gate insulating layer 13 may be formed on i) the active layer 12 and ii) source and drain electrodes 14b and 14c, electrically connected to the source and drain regions of the active layer 12. A gate electrode 14a, disposed between the source and drain electrodes 14b and 14c, may be formed on the gate insulating layer 13.

The passivation layer 15 may be formed on i) the source and drain electrodes 14b and 14c, ii) the gate insulating layer 13, and the gate electrode 14a. A via-hole may be formed on the passivation layer 15 to expose the source or drain electrode 14b or 14c.

The auxiliary gate electrodes 16a and 16b may be formed on the passivation layer 15 corresponding to the offset region. The anode electrode 16c, electrically connected to the source or drain electrode 14b or 14c through the via-hole, may be formed on the passivation layer 15 of the pixel region 220. In one embodiment, since the auxiliary gate electrodes 16a and 16b and the anode electrode 16c can be formed of the same material on the same plane, the number of masks can be reduced.

A pixel definition layer 17 may be formed on the passivation layer 15 and the anode electrode 16c so as to expose a partial region (light emitting region) of the anode electrode 16c. The organic light emitting layer 18 may be formed on the exposed anode electrode 16c. In addition, the cathode electrode 19 may be formed on the pixel definition layer 17 and the organic light emitting layer 18.

In one embodiment, as shown in FIG. 5B, a sealing substrate 400 for sealing the pixel region 220 is disposed on the top of the substrate 210 where the organic light emitting device 300 is formed and the sealing substrate 400 is bonded onto the substrate 210 by a sealing material 410 to form the display panel 200.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A thin film transistor, comprising:
    a substrate;
    an active layer formed over the substrate, wherein the active layer is formed of an oxide semiconductor;
    a gate insulating layer formed over the substrate and the active layer;
    source and drain electrodes formed on the gate insulating layer and electrically connected to the active layer;
    a gate electrode formed on the gate insulating layer and formed between the source and drain electrodes, wherein the gate electrode is spaced apart from the source electrode, wherein a first gap between the gate electrode and the source electrode is defined as a first offset region, wherein the gate electrode is spaced apart from the drain electrode, and wherein a second gap between the gate electrode and the drain electrode is defined as a second offset region;
    a passivation layer formed on i) the gate insulating layer, ii) the source and drain electrodes and iii) the gate electrode; and
    at least one auxiliary gate electrode formed on the passivation layer, wherein the auxiliary gate electrode comprises first and second auxiliary gate electrodes, wherein at least a portion of the first auxiliary gate electrode is located directly above the first offset region, wherein at least a portion of the second auxiliary gate electrode is located directly above the second offset region, and wherein the first and second auxiliary gate electrodes are formed on the same layer.

2. The thin film transistor of claim 1, wherein the source and drain electrodes are electrically connected to the active layer through a contact hole formed on the gate insulating layer.

3. The thin film transistor of claim 1, wherein the oxide semiconductor contains zinco oxide (ZnO).

4. The thin film transistor of claim 3, wherein the oxide semiconductor comprises at least one ion of: gallium (Ga), indium (In), stanium (Sn), zirconium (Zr), hafnium (Hf), cadmium (Cd), magnesium (Mg), and vanadium (V).

5. The thin film transistor of claim 3, wherein the oxide semiconductor comprises at least one ion of: 1-group elements, 13-group elements, 14-group elements, 15-group elements, and 17-group elements.

6. The thin film transistor of claim 1, wherein the auxiliary gate electrode overlaps the first offset region and the second offset region in a direction substantially perpendicular to the substrate.

7. A thin film transistor, comprising:
    a substrate;
    source and drain electrodes formed over the substrate;
    a gate electrode formed over the substrate and formed between the source and drain electrodes, wherein the gate electrode is spaced apart from the source electrode, wherein a first gap between the gate electrode and the source electrode is defined as a first offset region, wherein the gate electrode is spaced apart from the drain electrode, and wherein a second gap between the gate electrode and the drain electrode is defined as a second offset region;
    a gate insulating layer covering the gate electrode;
    an active layer formed on i) the gate insulating layer, ii) the source and drain electrodes and iii) at least part of the first and second offset regions;
    a passivation layer formed on the active layer; and
    at least one auxiliary gate electrode formed on the passivation layer, wherein at least a portion of the auxiliary gate electrode is located directly above the first offset region.

8. The thin film transistor of claim 7, wherein at least part of the auxiliary gate electrode overlaps with the gate electrode.

9. The thin film transistor of claim 7, wherein the at least one auxiliary gate electrode is a single piece electrode.

10. The thin film transistor of claim 7, wherein the source and drain electrodes and the gate electrode are made of the same material.

11. The thin film transistor of claim 7, wherein the active layer contains zinc oxide (ZnO).

12. A method of manufacturing a thin film transistor, comprising:
    forming a semiconductor active layer over a substrate;
    forming a gate insulating layer over the substrate and the active layer;
    forming i) source and drain electrodes, electrically connected to the active layer, on the gate insulating layer and ii) a gate electrode between the source and drain electrodes, wherein the gate electrode is spaced apart from the source electrode, wherein a first gap between the gate electrode and the source electrode is defined as a first offset region, wherein the gate electrode is spaced apart from the drain electrode, and wherein a second gap between the gate electrode and the drain electrode is defined as a second offset region;
    forming a passivation layer on i) the gate insulating layer, ii) the source and drain electrodes and iii) the gate electrode; and
    forming at least one auxiliary gate electrode on the passivation layer, wherein the auxiliary gate electrode comprises first and second auxiliary gate electrodes, wherein at least a portion of the first auxiliary gate electrode is located directly above the first offset region, wherein at least a portion of the second auxiliary gate electrode is located directly above the second offset region, and wherein the first and second auxiliary gate electrodes are formed on the same layer.

13. The method of claim 12, wherein the forming the source and drain electrodes, and the gate electrode comprises:

forming a contact hole on the gate insulating layer to expose a predetermined part of the active layer;

forming a conductive layer on the gate insulating layer to fill the contact hole; and forming the source and drain electrodes and the gate electrode by patterning the conductive layer.

14. The method of claim 12, wherein at least a portion of the auxiliary gate electrode overlaps with the gate electrode.

15. The method of claim 12, wherein the auxiliary gate electrode overlaps the first offset region and the second offset region in a direction substantially perpendicular to the substrate.

16. An organic light emitting display device, comprising:

a first substrate;

a second substrate disposed to face the first substrate, an organic light emitting device interposed between the first and second substrates, wherein the organic light emitting device comprises a first electrode, an organic light emitting layer, a second electrode and a thin film transistor configured to control an operation of the organic light emitting device; and wherein the thin film transistor comprises:

a substrate;

an active layer formed over the substrate, wherein the active layer is formed of an oxide semiconductor;

a gate insulating layer formed over the substrate and the active layer;

source and drain electrodes formed on the gate insulating layer and electrically connected to the active layer;

a gate electrode formed on the gate insulating layer and formed between the source and drain electrodes, wherein the gate electrode is spaced apart from the source electrode, wherein a first gap between the gate electrode and the source electrode is defined as a first offset region, wherein the gate electrode is spaced apart from the drain electrode, and wherein a second gap between the gate electrode and the drain electrode is defined as a second offset region;

a passivation layer formed on i) the gate insulating layer, ii) the source and drain electrodes and iii) the gate electrode; and at least one auxiliary gate electrode formed on the passivation layer, wherein the auxiliary gate electrode comprises first and second auxiliary gate electrodes, wherein at least a portion of the first auxiliary gate electrode is located directly above the first offset region, wherein at least a portion of the second auxiliary gate electrode is located directly above the second offset region, and wherein the first and second auxiliary gate electrodes are formed on the same layer.

17. The organic light emitting display device of claim 16, wherein the source and drain electrodes are electrically connected to the active layer through a contact hole formed on the gate insulating layer.

18. The organic light emitting display device of claim 16, wherein at least part of the auxiliary gate electrode overlaps with the gate electrode.

19. The organic light emitting display device of claim 16, wherein the auxiliary gate electrode and the first electrode are made of the same material on the same plane.

20. The organic light emitting display device of claim 16, wherein the auxiliary gate electrode overlaps the first offset region and the second offset region in a direction substantially perpendicular to the substrate.

* * * * *